United States Patent
Milde et al.

(10) Patent No.: US 6,420,863 B1
(45) Date of Patent: Jul. 16, 2002

(54) METHOD FOR MONITORING ALTERNATING CURRENT DISCHARGE ON A DOUBLE ELECTRODE AND APPARATUS

(75) Inventors: Falk Milde, Dresden; Torsten Winkler, Radeberg; Andreas Fickert, Zwickau; Volker Kirchhoff, Dresden; Matthias Fahland, Heidenau, all of (DE)

(73) Assignee: Fraunhofer-Gesellschaft zur Förderung der angewandten Forschung e.V, München (DE)

( * ) Notice: Subject to any disclaimer, the term of this patent is extended or adjusted under 35 U.S.C. 154(b) by 0 days.

(21) Appl. No.: 09/581,208

(22) PCT Filed: Oct. 19, 1999

(86) PCT No.: PCT/DE99/03383
§ 371 (c)(1),
(2), (4) Date: Jun. 21, 2000

(87) PCT Pub. No.: WO00/25344
PCT Pub. Date: May 4, 2000

(30) Foreign Application Priority Data

Oct. 22, 1998 (DE) ......................... 198 48 636

(51) Int. Cl.⁷ .................. G01R 17/16; G01N 27/00
(52) U.S. Cl. .................... 324/76.76; 324/71.1
(58) Field of Search ................. 324/771, 76.13, 324/76.76, 464, 536, 71.1; 702/58; 204/298.08, 298; 219/69.16; 250/492.3

(56) References Cited

U.S. PATENT DOCUMENTS

| | | | | |
|---|---|---|---|---|
| 4,625,283 A | * | 11/1986 | Hurley | 364/487 |
| 4,810,936 A | | 3/1989 | Nuckolls et al. | 315/119 |
| 5,303,139 A | | 4/1994 | Mark | 363/63 |
| 5,398,274 A | * | 3/1995 | Kamatani et al. | 378/98 |
| 5,539,303 A | * | 7/1996 | Okazako et al. | 324/71.1 |
| 5,584,974 A | | 12/1996 | Sellers | 204/192.13 |
| 5,698,082 A | * | 12/1997 | Teschner et al. | 204/298 |
| 5,839,092 A | * | 11/1998 | Earger et al. | 702/58 |
| 5,882,492 A | * | 3/1999 | Manley et al. | 204/298 |
| 5,982,181 A | * | 11/1999 | Rokunohe | 324/551 |
| 6,335,535 B1 | * | 1/2002 | Miyake et al. | 250/492.21 |

FOREIGN PATENT DOCUMENTS

| | | | |
|---|---|---|---|
| DE | 4326100 | 2/1995 | H01J/37/32 |
| DE | 4420951 | 12/1995 | H05H/1/46 |
| WO | 97/49267 | 12/1997 | H05B/37/02 |

OTHER PUBLICATIONS

Schiller et al., "Pulsed Magnetron Sputter Technologie", *Surface Coatings Technologie*, 61, pp. 331–337, (1993).
Rettich et al., "High Power Generators for Medium Frequency Sputtering Applications", Internet http://huettinger.com/mf_paper2.doc, (Jun. 11, 1997).

* cited by examiner

Primary Examiner—Michael J. Sherry
Assistant Examiner—Anand B. Amin
(74) Attorney, Agent, or Firm—Greenblum & Bernstein, P.L.C.

(57) ABSTRACT

Process for monitoring an alternating-voltage discharge between the electrodes of a double electrode and an apparatus. The process includes measuring values of at least one of a discharge current and a discharge voltage for each half-wave within an alternating-voltage discharge period, determining a difference between the measured values of a second half-wave and the measured values of the first half-wave, and comparing the determined differences to specific tolerance values. When the specific tolerance values are exceeded by the determined differences, a power supply is reduced, whereby the discharge is at least briefly suppressed. The apparatus includes a double magnetron including first and second targets arranged to form a double electrode, and a power supply coupled to supply power to the first and second targets. The power supply includes a measurement unit for measuring values of at least one of discharge current and discharge voltage, such that at least one of a discharge current and a discharge voltage for each half-wave within an alternating-voltage discharge period is measured. A device for determining a difference between the measured values of a second half-wave and the measured values of the first half-wave is provided, as well as a device for comparing the determined differences to specific tolerance values, and a device for at least briefly suppressing the discharge when the specific tolerance values are exceeded by the determined differences.

18 Claims, 2 Drawing Sheets

METHOD FOR MONITORING ALTERNATING CURRENT DISCHARGE ON A DOUBLE ELECTRODE AND APPARATUS

CROSS-REFERENCE TO RELATED APPLICATIONS

The present application is a U.S. National Stage Application of International Application No. PCT/DE99/03383 filed Oct. 19, 1999, which claims priority under of German Patent Application No. 198 48 636.7 filed Oct. 22, 1998.

BACKGROUND OF THE INVENTION

1. Field of the Invention

The invention relates to a method for monitoring an alternating-voltage discharge on a double electrode, especially between two targets for cathodic sputtering. The method is used to avoid a change-over of the discharge from the state of the anomalous glow discharge to an arc discharge.

2. Discussion of Background Information

In this connection, the double electrode is basically an arrangement for an alternating-voltage discharge between two individual electrodes. The individual electrodes are placed alternatingly on cathodic and anodic potential. The method-related use of the alternating-voltage discharge can serve different purposes. On the one hand, the parameters and the electrode materials can be selected in such a way that essentially the plasma being formed with the discharge is used technically. On the other hand, the parameters and the electrode materials used can be selected in such a way that these materials are always sputtered on the cathodic side by the discharge. The latter method, cathodic sputtering or simply sputtering, is used in this method to deposit the electrode materials as a thin layer on a substrate. In practice, the electrodes are designated in cathodic sputtering as targets, corresponding to the target material.

The frequency, i.e., the phases of switching the electrodes between anodic and cathodic potential, is normally between 10 and 80 kHz in practice.

The progression of the current or voltage curves is symmetrically sinusoidal for the most part, but can also deviate therefrom. The impedance can also be asymmetrical, for example, if different types of target materials are to be deposited in parallel at different speeds (sputtering rates).

The invention can be used for simple cathodic sputtering devices as well as for the more effective magnetic field-supported magnetrons.

The use of double electrodes for cathodic sputtering is preferred in facilities in which very high sputtering rates are required so that, on the other hand, high deposition rates can be achieved when coating selected substrates. For example, these types of devices are operated as double magnetrons in a reactive atmosphere to deposit insulating layers.

Basically, two methods are known from the prior art for generating an alternating-voltage discharge. It is preferred for two direct-current sources with opposed potential to be alternatingly switched on the two electrodes of the double electrode. The method is also designated as Pulse Magnetron Sputter Process (PMS) (Schiller et al. "Pulsed Magnetron Sputter Technology", Surface Coating Technology, 61, pages 331–337, 1993). On the other hand, the alternating-voltage discharge can be generated with a medium frequency generator, which basically generates sinusoidal current and/or voltage curves.

The invention is used for monitoring the alternating-voltage discharge, especially the monitoring of a discharge in which an alternating-current generator is used as an energy source. However, the method can also be used for monitoring an alternating-voltage discharge with two direct-current sources.

The problem in operating an alternating-voltage discharge on a double electrode with an alternating-current generator is that, in the case of the often very high electrical power used in practice, the discharge must continuously lie in the area of the anomalous glow discharge. A change-over of the discharge to an arc discharge may not take place. The anomalous glow discharge is the prerequisite for the discharge taking place over the entire effective cathode surface. This is the prerequisite for a uniform, error-free, and large-surface coating of the substrate or the substrate arrangement.

While, with an alternating-voltage discharge with two direct-current sources, the cathodic and anodic potentials are made available separately and always start from a zero potential, an alternating-voltage discharge with an alternating-current generator can drift to one electrode. As a result, the glow discharge can assume an asymmetry between the targets in which one target assumes a higher cathodic potential without the character of the sinusoidal current-voltage curve changing considerably. As a result, the danger of forming an arc discharge on the respective target increases.

The causes of a change-over of the discharge from an anomalous glow discharge to an arc discharge are diverse and cannot be completely excluded in practical operation. Thus, the causes of malfunctions could lie, for example, in the formation of flakes of sputtered material that flake off device parts and/or cause local overheating on the electrode surfaces. Malfunctions occur due to the short-term growth of insulating layers on the target. Additional malfunctions can be a function of the device or switching.

The arc discharge, also called vacuum arc discharge, is characterized in that it essentially has a lower impedance than the anomalous glow discharge, i.e., with the same power, the arc drop voltage is considerably lower and the discharge current is correspondingly greater. The arc discharge is connected with a punctiform vaporization of electrode material, which should be avoided in the process technology of cathodic sputtering under discussion. In this connection, the danger of the formation of an arc discharge exists in an increased degree with reactive process management.

Monitoring the power supply for individual magnetrons using measuring techniques is known from the prior art, in which the total current and/or voltage is measured and, when absolute values are exceeded, particularly with respect to the discharge current, the energy supply to the device is briefly interrupted.

Rettich and Wiedemuth ("High power generators for medium frequency sputtering applications", Internet http://huetinger.com/mf_paper2.doc, /Jun. 11, 1997/) describe the requirements for a power supply for a double magnetron with a medium frequency generator. In this connection, the discharge is monitored by means of measuring the total discharge current and the discharge voltage. A possible change-over of the anomalous glow discharge to an arc discharge is reacted to in two different ways, which are a function of the type of arc. Accordingly, an individual short-term arc (single arc) is tolerable, which, though it causes an increase in current, extinguishes again after a waiting period that can be set in advance. In such a case, the generator operates as an energy source without interruption. If an excessive discharge current is measured via an arc discharge (hard arc), which exceeds the limit for the discharge current and the waiting period, the generator reacts within milliseconds by reducing the output power for a short time. As a result, the arc is extinguished. Afterwards, the normal method conditions are reset. If an arc discharge forms again, the generator is shut down and an error message is issued for the operator.

DE 43 26 100 A1 discloses a method and a device for coating substrates with a device for detecting and suppressing undesired electric arcs. In this connection, recording the measured values in a specific part of the half-wave is emphasized as a special feature that increases the reliability of detecting an arc.

It cannot be determined with the total current measurement of discharge current whether the discharge is occurring symmetrically or drifting asymmetrically to a target without the total current changing considerably. In such a case, the targets are sputtered at different speeds and it can easily come to a change-over of the glow discharge to an arc discharge, for example, due to the overheating of one of the targets.

In general, according to prior art, the discharge voltage, the discharge current or both in combination can be detected and, in the case of an impermissible deviation, the supply of energy to the discharge device can be briefly interrupted.

In this connection, it is problematic that, in the case of high power with frequencies of 10 to 80 kHz, various misinterpretations can occur for the anode/cathode switch-over and the interruption of the energy supply to the discharge devices frequently occurs unnecessarily in a disruptive manner. The recording of the discharge voltages and/or discharge currents that change with high frequency is influenced in practice in many cases by negligible, summary fluctuations that are not the result of the beginning of an arc discharge.

However, unnecessary, frequent shutting down of the double electrode due to misinterpretations of the recorded method parameters leads to undesirable process instabilities, which, with complicated coating tasks, can lead to the formation of defective, non-homogenous layers.

If the tolerance ranges of the monitored measured values are increased as a consequence of the described state of affairs, the danger exists, on the other hand, that, despite monitoring, a change-over from the anomalous glow discharge to an arc discharge does indeed occur, the supply of energy is not interrupted and, consequently, the technological task is disturbed in an impermissible manner.

SUMMARY OF THE INVENTION

As a result, the invention is directed to a method for monitoring a double electrode, with which a change-over or development into a change-over of an alternating-voltage discharge from the state of an anomalous glow discharge to an arc discharge can be detected with a high degree of certainty.

The present invention provides a process similar in general to the process discussed above which also includes that the discharge current and/or the discharge voltage of each of the two half-waves is/are measured within an alternating-voltage discharge period and the difference between the respective measured values of the second half-wave and the corresponding measured values of the first half-wave are compared to specific tolerance values. When the tolerance values are exceeded, the power supply is reduced so that the discharge is briefly suppressed.

Advantageous further developments of the invention are characterized in the sub-claims and are described in greater detail in the following along with a description of a preferred design of the invention in the exemplary embodiment.

The core of the invention is that the discharge current and/or the discharge voltage of each of the two half-waves within a period of the alternating-voltage discharge is recorded as a measured value. In the case of a deviation of the measured value of the subsequent half-wave from the measured value of the preceding half-wave from a method-specific tolerance value, the discharge is briefly interrupted. As compared to prior art, it is no longer necessary for a static or dynamically carried comparison value to be prescribed for the still-tolerable discharge current and/or discharge voltage. As a result, the reliability of the detection of the beginning of an arc discharge is increased considerably.

In further embodiments of the invention the ratios of discharge current and discharge voltage of the two electrodes can be recorded and compared to corresponding tolerance values.

In the case of certain method-specific ratios, it can also be advantageous to compare a summary or average measured value over several half-waves with a corresponding measured value of preceding half-waves. The measured value formation can take place, for example, via two or five half-waves. With a larger number of half-waves, it can already come to the undesired formation of an arc. In detail, these types of variations depend considerably upon concrete technological conditions and circumstances.

The essential advantage of invention is that not only the total current can be monitored, but the discharge current on every electrode for each half-wave. Of particular significance in this connection is the reliable detection of asymmetrical discharge currents.

Various smaller deviations from absolute tolerance values, which individually do not lead to a change-over of the glow discharge to an arc discharge, can be eliminated as non-essential and the process flow can be continued undisturbed without shutting down. In many cases, despite relatively large deviations from the prescribed process parameters, there is actually no concrete danger of a change-over to an arc discharge.

However, as soon as, due to circumstances, the discharge current of a half-wave increases above a tolerance value as compared to the preceding half-wave, it must be assumed that this is not merely a regulation-related shift in the process parameters or small process-induced malfunctions and the discharge is interrupted so that no arc discharge can form.

The instant invention is directed to a process for monitoring an alternating-voltage discharge between the electrodes of a double electrode. The process includes measuring values of at least one of a discharge current and a discharge voltage for each half-wave within an alternating-voltage discharge period, determining a difference between the measured values of a second half-wave and the measured values of the first half-wave, and comparing the determined differences to specific tolerance values. When the specific tolerance values are exceeded by the determined differences, a power supply is reduced, whereby the discharge is at least briefly suppressed.

According to a feature of the present invention, the alternative-voltage discharge can be monitored between two targets for cathodic sputtering.

In accordance with another feature of the invention, the first half-wave value may be a positive current.

Moreover, the determined difference may be a difference between one-half of a magnitude of the at least one of the discharge current and the discharge voltage between a peak of the first half-wave and a peak of the second half-wave and the measured value of the second half-wave of the at least one of the discharge current and the discharge voltage.

Further, the determined difference can be, a difference between one-half of a total discharge current between peak values of the first and second half-waves and the measured value of the second half-wave of the discharge current.

The determined difference can also be a difference between one-half of a total discharge voltage between peak values of the first and second half-waves and the measured value of the second half-wave of the discharge voltage.

According to still another feature of the present invention, the determined difference may be determined from ratio values of different measured values of the measured half-waves to specific ratio tolerance values.

In accordance with a further feature of the invention, the determined difference between one or more periods and the determined difference between one or more preceding periods can be compared to specific tolerance values.

Further, an average of determined differences of one or more periods may be compared to the specific tolerance values.

At least one of a total discharge current and a total discharge voltage between peaks of the first and the second half-waves can remain substantially constant.

The present invention is also directed to an apparatus. The apparatus includes a double magnetron including first and second targets arranged to form a double electrode, and a power supply coupled to supply power to the first and second targets. The power supply includes a measurement unit for measuring values of at least one of discharge current and discharge voltage, such that at least one of a discharge current and a discharge voltage for each half-wave within an alternating-voltage discharge period is measured. A device for determining a difference between the measured values of a second half-wave and the measured values of the first half-wave is provided, as well as a device for comparing the determined differences to specific tolerance values, and a device for at least briefly suppressing the discharge when the specific tolerance values are exceeded by the determined differences.

According to a feature of the instant invention, a switching element may be coupled between the power supply and the first and second targets. The switching element may include a measuring element for recording a duration of the half-waves.

In accordance with another feature of the present invention, the first and second targets can include titanium.

According to still another feature of the invention, the first and second targets can have an overall electrode area of 12,000 cm$^2$.

Moreover, a vacuum chamber can be provided, within which the double magnetron may be located. The vacuum chamber can include inlets for forming a reactive oxygen atmosphere within the vacuum chamber, and a working pressure of $3\times10^{-1}$ Pa can exerted within the vacuum chamber.

In accordance with yet another feature of the present invention, the device for at least briefly suppressing the discharge can include a device for reducing the power supplied to the first and second targets. by the power supply.

The invention is explained in greater detail in the following based upon an exemplary embodiment.

DETAILED DESCRIPTION OF THE PRESENT INVENTION

Figure 1A:
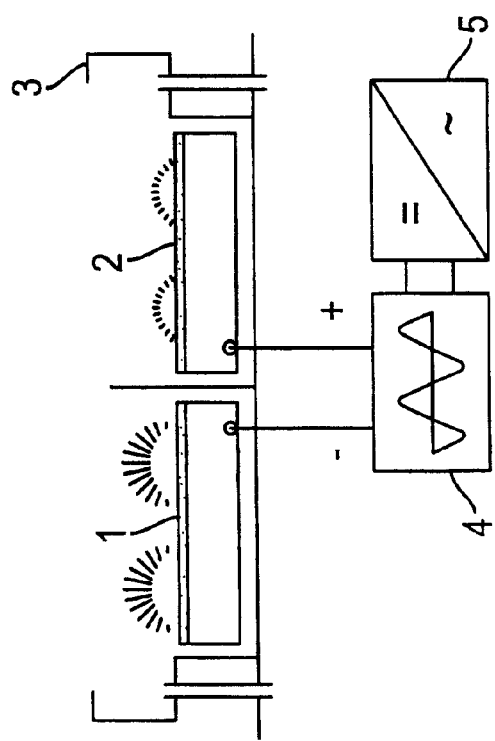
FIGS. 1a and 1b illustrate an arrangement for a double magnetron.
Figure 1B:
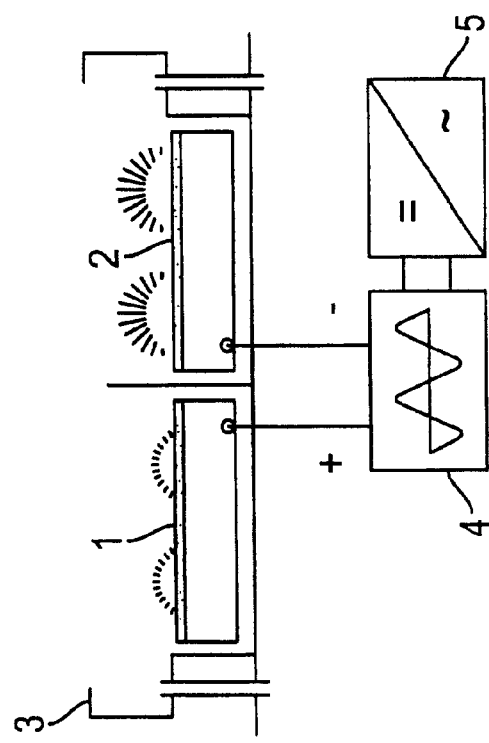

The same double magnetron is shown in FIGS. 1a and 1b, in which a target 1 and a target 2 electrically form the double electrode. With respect to the additional embodiments, FIG. 1a represents the relationships for a first half-wave of the discharge and FIG. 1b represents the following half-wave within a period of the alternating current.

The targets 1 and 2 are arranged in a housing-like sheathing 3 and are shielded against one another. The targets 1 and 2 are attached to a switching unit 4 outside the sheathing 3 as well as outside the coating chamber. The switching unit realizes the pole reversal between cathodic and anodic potential. The switching unit 4 is connected electrically directly with a power supply unit 5.

The devices to record the actual discharge current, the discharge voltage, and the actual duration of the individual half-waves are not shown in greater detail. The measuring elements for the discharge current and discharge voltage are located in the power supply unit 5 and the measuring element for recording the actual duration of the respective half-waves is located in the switching element 4.

For example, this double magnetron is supposed to deposit a $TiO_2$ layer for optical purposes with a high sputtering rate on a glass substrate.

The double magnetron is made of two equally large titanium (Ti) targets and is arranged in a vacuum chamber as a coating chamber. The cathodic sputtering takes place in this connection in a reactive oxygen atmosphere. For this purpose, a mixture of argon (Ar) and oxygen ($O_2$) up to a working pressure of approximately $3\times10^{-1}$ Pa is admitted to the coating chamber, whereupon the mixture ratio is adjusted in such a way that the titanium reacts with the oxygen in the process flow and a $TiO_2$ layer is deposited on the glass substrate.

After the required process parameters in the coating chamber have been reached, the two targets of the double magnetron are applied to an alternating-current generator with a sinusoidal current-voltage curve. The discharge voltage is 1000 V with a frequency of 30 kHz. The effective discharge current is adjusted to a total current of approximately 140 A. The peak values of each half-wave of a period of the alternating-voltage discharge are supposed to be 200 A. The exemplary targets 1 and 2 have an overall electrode area of 12,000 cm$^2$. With a discharge current of 50 A, this results in a current density of approximately 4 mA/cm$^2$. Under these conditions, an anomalous glow discharge ignites between the two targets and there is alternating sputtering of the respective titanium target connected to the cathodic potential at a high sputtering rate.

With these types of high discharge currents, the danger exists in practice basically that the required anomalous glow discharge will change into an arc discharge due to various malfunctions. This applies to a particular degree in the case of reactive processes such as, in the example, in connection with the reactive oxygen atmospheres. Since malfunctions also occur regularly in layer formation and, in some cases, even the already built-up layer is rendered useless, this should be avoided as much as possible.

According to the invention, the discharge current of the alternating-voltage glow discharge is supposed to be monitored and impermissible malfunctions detected. If impermissible malfunctions are detected, the discharge is interrupted as a consequence.

An unnecessary and frequent shutting down and re-igniting of the discharge due to even only momentarily occurring deviations of the discharge parameters being registered as "impermissible" is disadvantageous for layer formation and should be avoided to a large extent.

Deviations in the discharge parameters that are caused by switching-related fluctuations have proven to be predominantly non-critical. Malfunctions also occur due to process-induced formations of small-scale insulating $TiO_2$ layers on the Ti target, which, in the course of the cathodic sputtering, are typically deposited in the short term from the target surface. Another cause is the formation of process-induced titanium flakes.

Malfunctions that by nature have only a short-term existence and do not regularly lead to the formation of a critical stable arc discharge should be recognized as such so that the discharge is not shut down unnecessarily.

Malfunctions that can lead to the formation of a stable arc discharge are generated for the most part by local overheating at a point on one of the targets 1 or 2. As a result, with constant total current, the discharge current drifts more or less quickly in the direction of this target 1 or 2.

When using the solution according to the invention, the peak value of the discharge current of each half-wave, i.e., the current via the target 1 and via the target 2 is monitored. In the case of a malfunction-free discharge, the total current is distributed uniformly to the two half-waves of a period.

Figure 2:
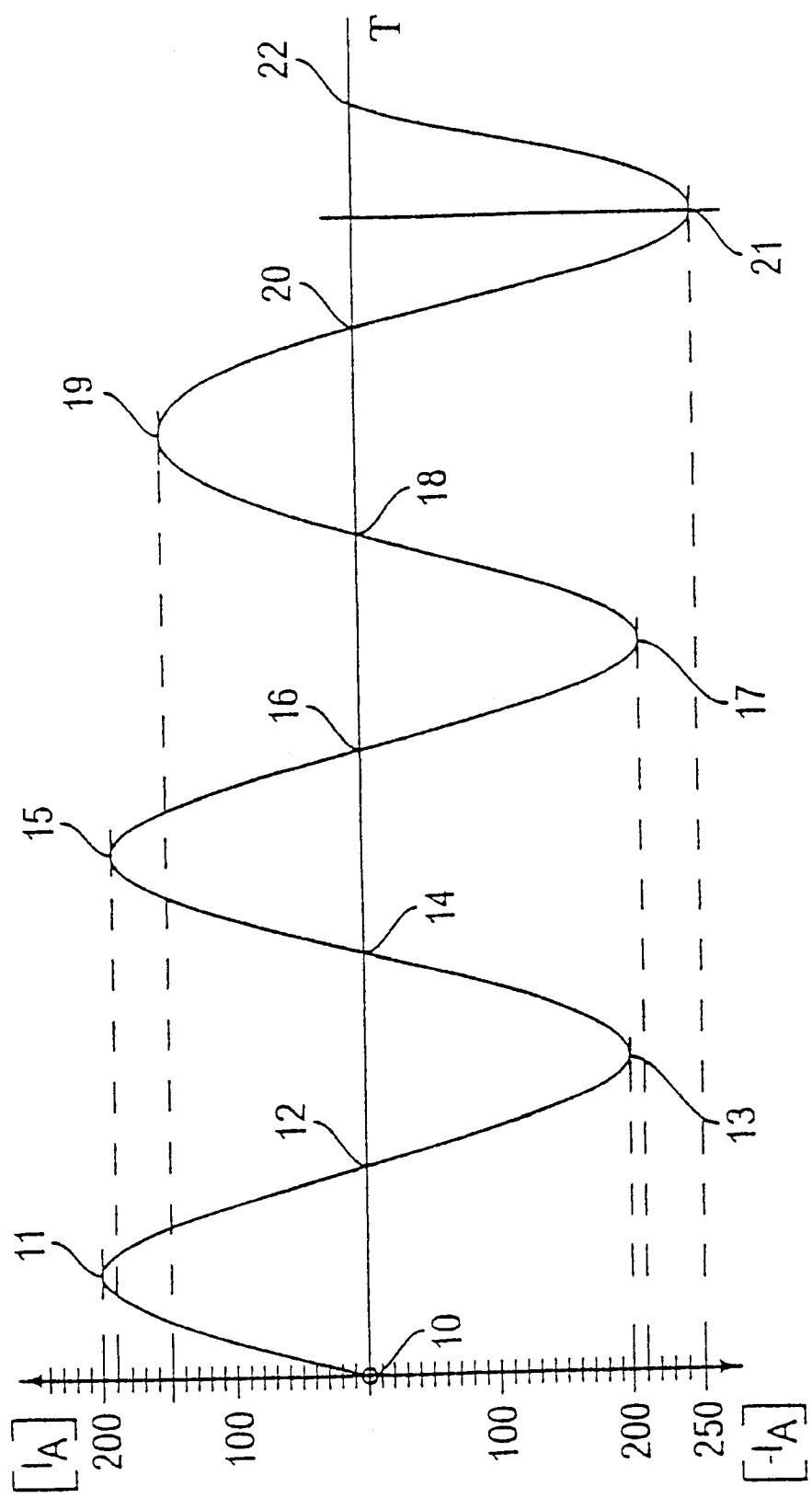
FIG. 2 illustrates an exemplary curve of a discharge current for the double magnetron depicted in FIGS. 1a and 1b.

FIG. 2 shows this type of uniform discharge, i.e., glow discharge, between points 10 to 14. The peak values of the discharge current at the two half-waves at point 11 and 13 are uniformly ±200 A. The maximum total current is 400 A (peak value). In the case of monitoring within this period, a difference of zero is determined between points 11 and 13. The discharge can continue to be maintained undisturbed.

Malfunctions, even if they are only short-term, lead to fluctuations of the discharge current, i.e., to a low increase in the discharge current. Non-critical malfunctions regularly cause only short and limited fluctuations in the discharge current.

In addition, FIG. 2 illustrates a non-critical malfunction in a period between the points 14 to 18. The first half-wave of this period reaches a peak value of the discharge current of 190 A at point 15 and in the second half-wave a value of −210 A at point 17. This results in a difference of −20 A. In the example, this value lies within the process-specific permissible tolerance. The discharge will be continued without interruption.

In the following period between points 18 to 22, in the first half-wave, a peak current of 150 A is measured at point 19 and a value of −250 A is measured in the second half-wave at point 21. This results in a difference of −100 A. This difference lies outside the permissible tolerance and the discharge is directly extinguished by lowering or shut down.

As a result, a critical shift of the peak values with an unchanged total current between the peak values of the half-waves of 400 A was detected in the last example. The discharge shifts in the direction of one of the targets 1 or 2 and the danger exists that an arc discharge will form there. According to prior art, with the monitoring of the total current, this type of shift would not be detected. According to the state of the art, an arc discharge that has actually already been initiated is always detected if the discharge voltage crashes at a value for an arc discharge for the most part below 50 V and the maximum total discharge current increases considerably in the process.

It is advantageous if, in addition to the described monitoring of the two half-wave peak current values in a period, the differential values of the preceding period or a multiplicity, for example, 2 to 5 periods, are still saved. Thus, the values of the following periods can also be compared to those of the preceding periods. As a result, slowly developing shifts can be detected especially well. Parallel to the discharge current, it can be advantageous process-specifically to also monitor the discharge voltage and the actual duration of the individual half-waves of a period and to include these in the evaluation of the burn characteristic of the ongoing glow discharge.

Under certain use conditions, it can also be advantageous to record the deviations of the discharge current of the half-waves as an average deviation over several periods and to compare this with corresponding permissible tolerance limits.

In this process, intervals of 3 to 5 half-waves, for example, have proven to be advantageous. With this type of switching, even overlaid malfunctions with different causes, which always only occur in individual half-waves, are filtered out. If, on the other hand, an increased discharge current is detected over several half-waves, the danger is relatively high that a change-over to an arc discharge is approaching.

Of course, the invention is not limited to the described exemplary embodiment. Thus, it is possible without hesitation that the measured values of the discharge current and the discharge voltage are utilized as a ratio or via factors to detect impermissible malfunctions. In a similar way, changes in frequency can also be used to evaluate the actual discharge ratio.

What is claimed is:

1. A process for monitoring an-alternating-voltage discharge between the electrodes of a double electrode, comprising:
   measuring values of at least one of a discharge current and a discharge voltage for each half-wave within an alternating-voltage discharge period;
   determining a difference between the measured values of a second half-wave and the measured values of the first half-wave;
   comparing the determined differences to specific tolerance values,
   wherein, when the specific tolerance values are exceeded by the determined differences, a power supply is reduced, whereby the discharge is at least briefly suppressed.

2. The process in accordance with claim 1, wherein the first half-wave value is the positive current.

3. The process in accordance with claim 1, wherein the determined difference is a difference between one-half of a magnitude of the at least one of the discharge current and the discharge voltage between a peak of the first half-wave and a peak of the second half-wave and the measured value of the second half-wave of the at least one of the discharge current and the discharge voltage.

4. The process in accordance with claim 1, wherein the determined difference is a difference between one-half of a total discharge current between peak values of the first and second half-waves and the measured value of the second half-wave of the discharge current.

5. The process in accordance with claim 1, wherein the determined difference is a difference between one-half of a total discharge voltage between peak values of the first and second half-waves and the measured value of the second half-wave of the discharge voltage.

6. The process in accordance with claim 1, wherein the determined difference is determined from ratio values of different measured values of the measured half-waves to specific ratio tolerance values.

7. The process in accordance with claim 1, wherein the determined difference between one or more periods and the determined difference between one or more preceding periods are compared to specific tolerance values.

8. The process in accordance with claim 1, wherein an average of determined differences of one or more periods are compared to the specific tolerance values.

9. The process in accordance with claim 1, wherein at least one of a total discharge current and a total discharge voltage between peaks of the first and the second half-waves remain substantially constant.

10. A process for monitoring an alternating-voltage discharge between the electrodes of a double electrode, comprising:

measuring values of at least one of a discharge current and a discharge voltage for each half-wave within an alternating-voltage discharge period;

determining a difference between the measured values of a second half-wave and the measured values of the first half-wave;

comparing the determined differences to specific tolerance values, wherein, when the specific tolerance values are exceeded by the determined differences, a power supply is reduced, whereby the discharge is at least briefly suppressed, and wherein the alternative-voltage discharge is monitored between two targets for cathodic sputtering.

11. An apparatus comprising:

a double magnetron comprising first and second targets arranged to form a double electrode;

a power supply coupled to supply power to said first and second targets, said power supply comprising a measurement unit for measuring values of at least one of discharge current and discharge voltage, whereby at least one of a discharge current and a discharge voltage for each half-wave within an alternating-voltage discharge period is measured;

a device for determining a difference between the measured values of a second half-wave and the measured values of the first half-wave;

a device for comparing the determined differences to specific tolerance values; and a device for at least briefly suppressing the discharge when the specific tolerance values are exceeded by the determined differences.

12. The apparatus in accordance with claim 11, further comprising a switching element coupled between said power supply and said first and second targets.

13. The apparatus in accordance with claim 12, wherein said switching element comprises a measuring element for recording a duration of said half-waves.

14. The apparatus in accordance with claim 11, wherein said first and second targets comprise titanium.

15. The apparatus in accordance with claim 11, wherein said first and second targets have an overall electrode area of 12,000 cm$^2$.

16. The apparatus in accordance with claim 11, further comprising a vacuum chamber within which the double magnetron is located.

17. The apparatus in accordance with claim 16, wherein the vacuum chamber includes inlets for forming a reactive oxygen atmosphere within the vacuum chamber, and a working pressure of $3 \times 10^{-1}$ Pa is exerted within the vacuum chamber.

18. The apparatus in accordance with claim 11, wherein the device for at least briefly suppressing the discharge comprises a device for reducing the power supplied to the first and second targets by the power supply.

* * * * *